(12) United States Patent
Choi et al.

(10) Patent No.: US 11,409,676 B2
(45) Date of Patent: Aug. 9, 2022

(54) SYSTEM ON CHIP, MEMORY DEVICE, ELECTRONIC DEVICE COMPRISING THE SOC AND MEMORY DEVICE, AND METHOD FOR STORING DATA IN THE ELECTRONIC DEVICE

(71) Applicant: Samsung Electronics Co., Ltd., Suwon-si (KR)

(72) Inventors: Ji Hyun Choi, Daegu (KR); Hyun-Joong Kim, Yongin-si (KR); Joon Sik Sohn, Yongin-si (KR); Woong-Jae Song, Seoul (KR); Soo-Woong Ahn, Seoul (KR); Seung-Hyun Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 17/016,883

(22) Filed: Sep. 10, 2020

(65) Prior Publication Data
US 2021/0182223 A1 Jun. 17, 2021

(30) Foreign Application Priority Data
Dec. 16, 2019 (KR) ........................ 10-2019-0167984

(51) Int. Cl.
*G06F 13/16* (2006.01)
*G11C 7/10* (2006.01)

(52) U.S. Cl.
CPC ........ *G06F 13/1684* (2013.01); *G11C 7/1006* (2013.01); *G11C 7/1051* (2013.01)

(58) Field of Classification Search
CPC .. G11C 7/1006; G11C 7/1051; G06F 13/1684
USPC ........................................................ 711/154
See application file for complete search history.

(56) References Cited

U.S. PATENT DOCUMENTS

| | | | |
|---|---|---|---|
| 6,064,612 A | 5/2000 | Agata | |
| 7,899,961 B2 | 3/2011 | Kao | |
| 8,260,992 B2 | 9/2012 | Dearth et al. | |
| 8,451,913 B2 | 5/2013 | Oh et al. | |
| 9,244,875 B1 | 1/2016 | Loke et al. | |
| 9,384,822 B2 | 7/2016 | Shu et al. | |
| 9,798,693 B2 | 10/2017 | Hollis | |
| 2017/0344051 A1 | 11/2017 | Patel | |

(Continued)

FOREIGN PATENT DOCUMENTS

JP        2016514441 A       5/2016

*Primary Examiner* — Son L Mai
(74) *Attorney, Agent, or Firm* — Harness, Dickey & Pierce, P.L.C.

(57) ABSTRACT

Provided is a SoC, a memory device, an electronic device and a method for storing data in an electronic device. The electronic device comprises a host configured to output data, and a memory device including a memory storage configured to receive the data and to store the data. The host is configured to generate data bus inversion (DBI) information on the data to be provided to the memory device in accordance with a data parallelizing system, the data parallelizing system being inside the memory device, and to provide the DBI information to the memory device. The memory device is configured to provide the data to the memory storage, the data output from the host, the data encoded in accordance with the DBI information, the providing the data being in accordance with the data parallelizing system.

20 Claims, 15 Drawing Sheets

(56) References Cited

U.S. PATENT DOCUMENTS

2018/0285304 A1 10/2018 Kozhikkottu et al.
2020/0251159 A1* 8/2020 Lanka ................. G06F 13/1647
2021/0304802 A1* 9/2021 Lee ..................... G11C 7/1084

* cited by examiner

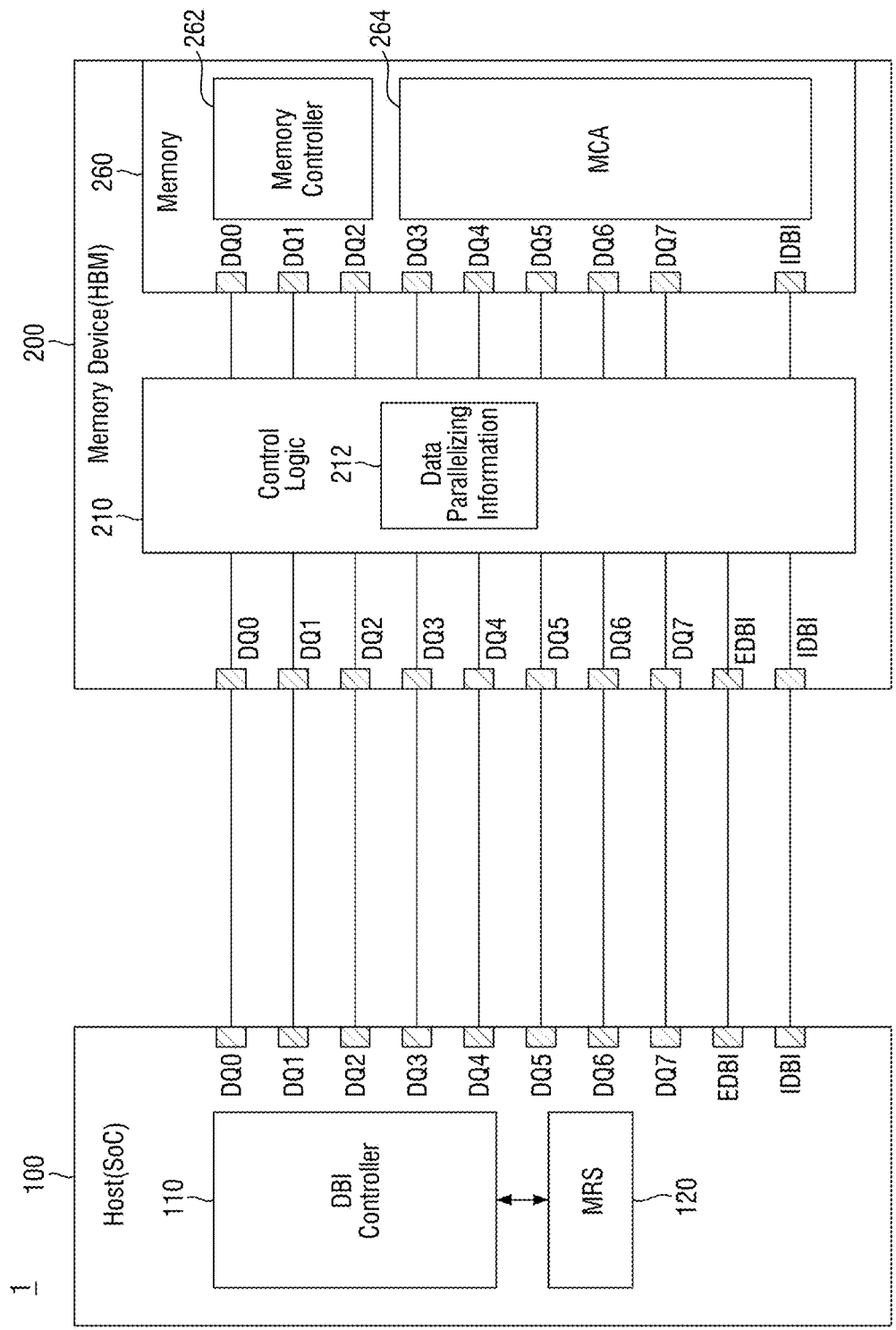
[FIG. 1]

[FIG. 2]
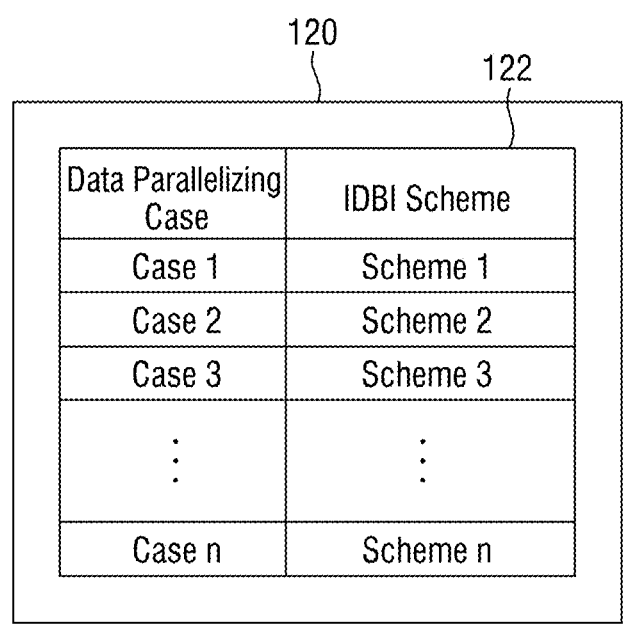

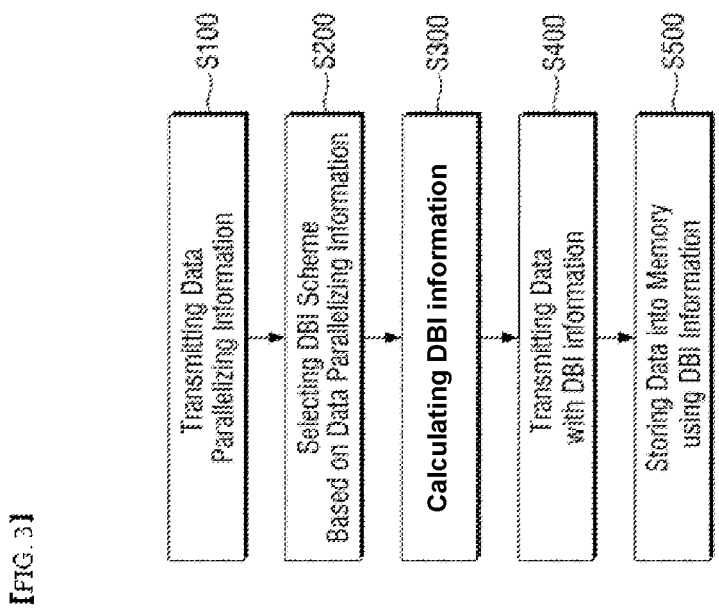
[FIG. 3]

[FIG. 4]
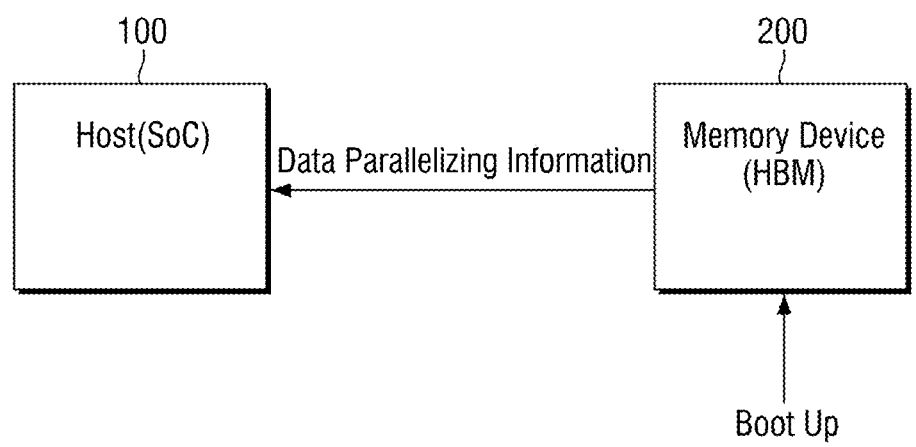

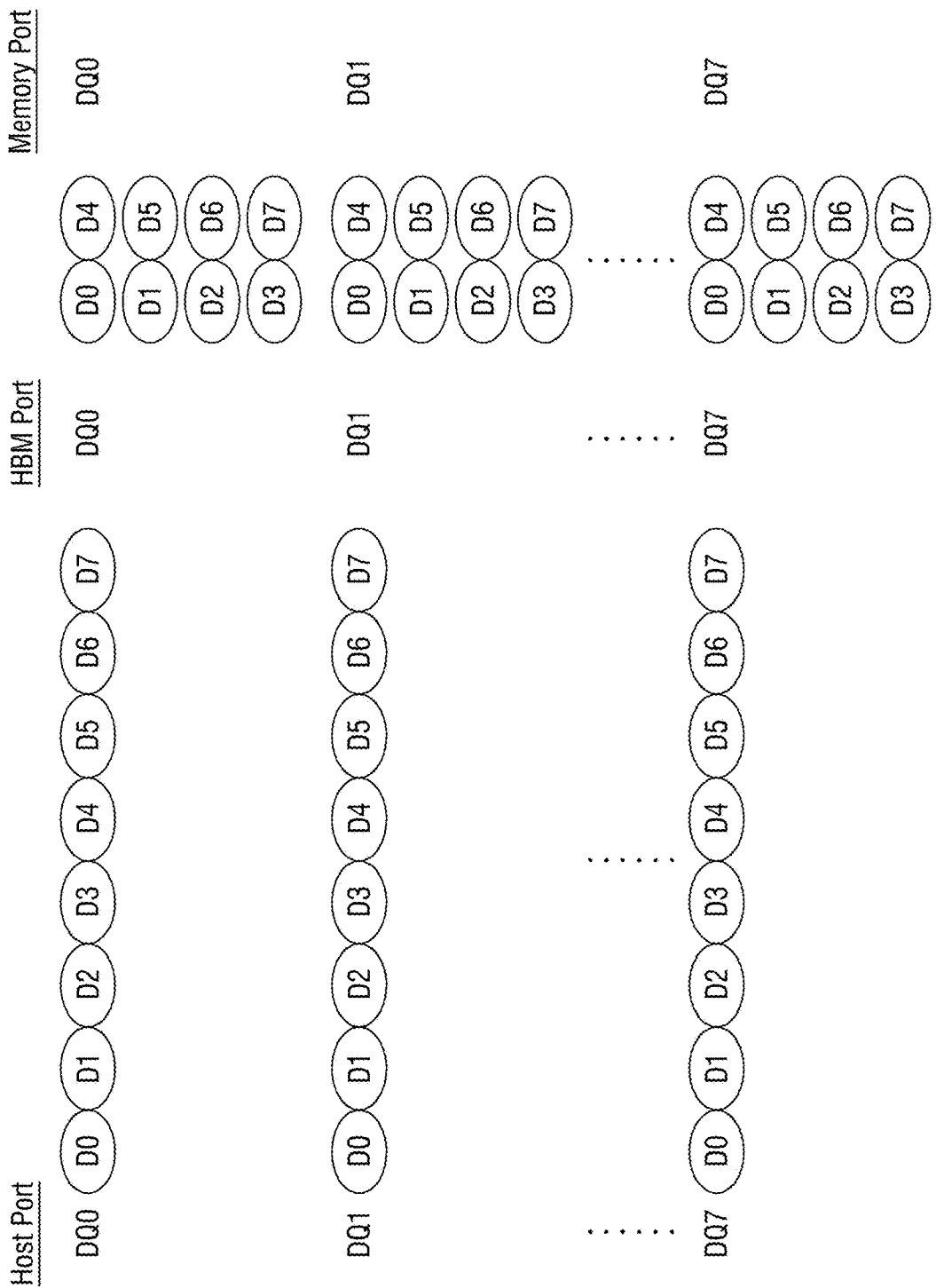
[FIG. 5]

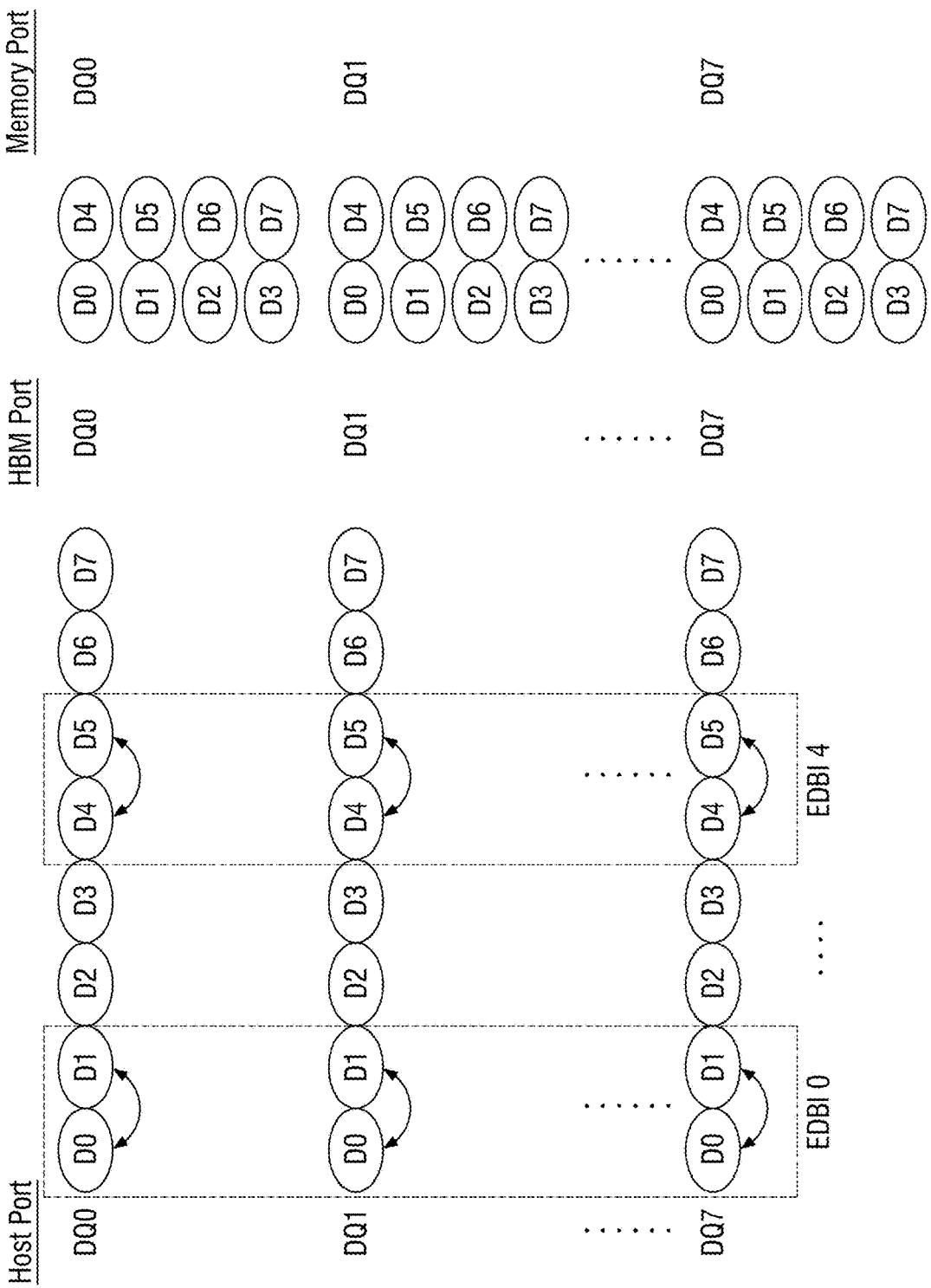

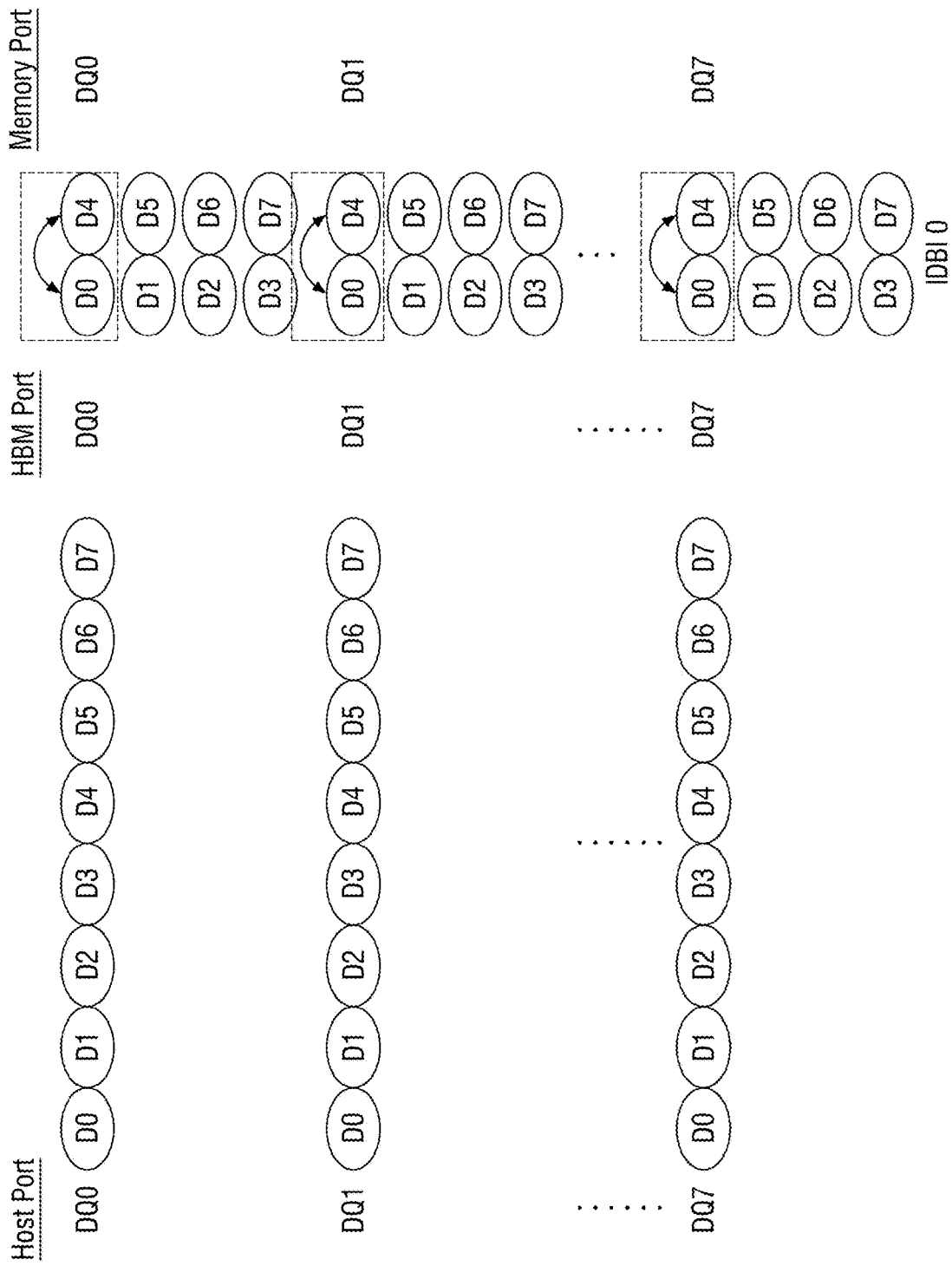
[FIG. 7]

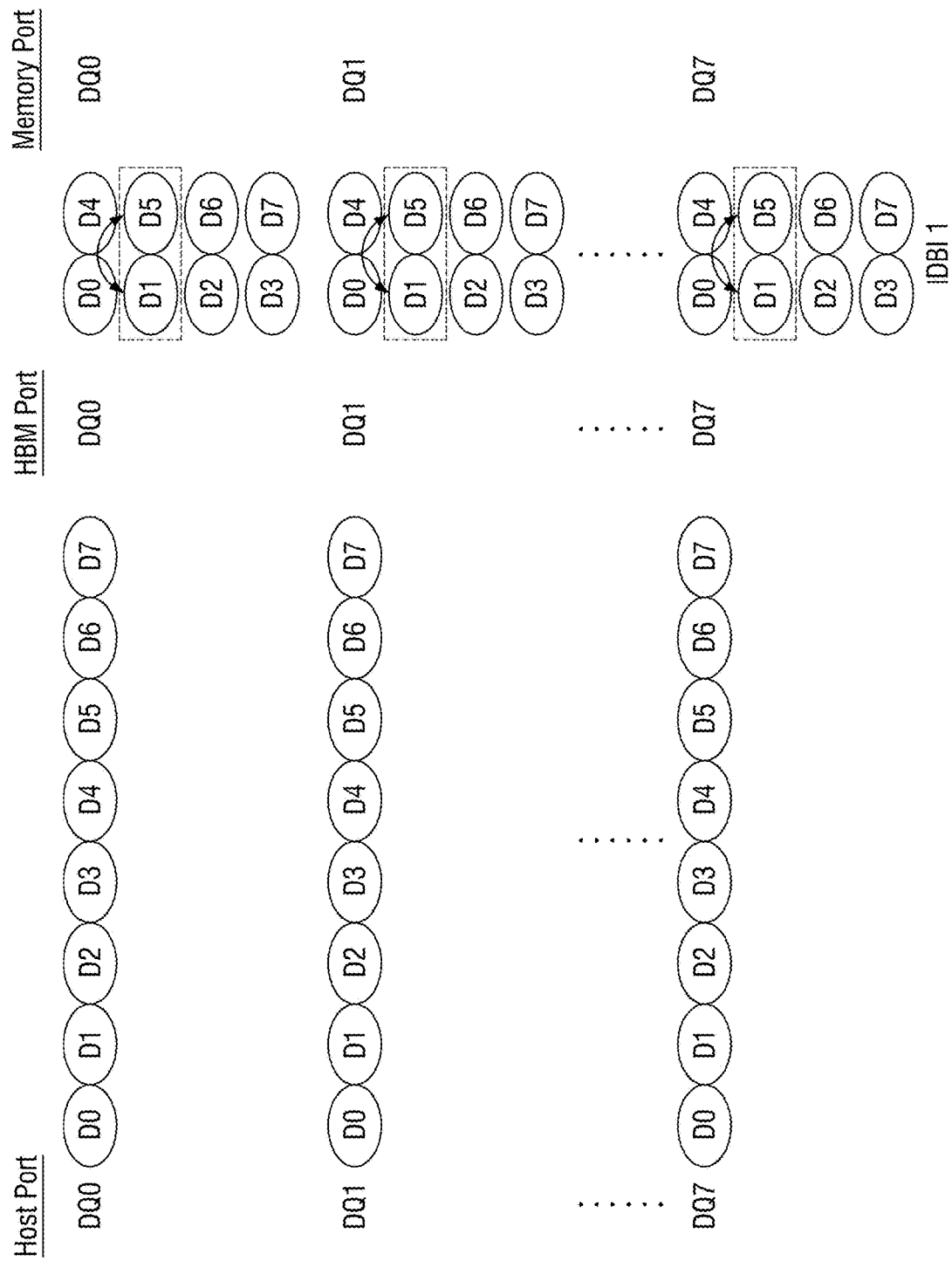
[FIG. 8]

[FIG. 9]

| Host Port | t1 | t2 | t3 | t4 | t5 | t6 | t7 | t8 | HBM Port |
|---|---|---|---|---|---|---|---|---|---|
| DQ0 | D0 | D1 | D2 | D3 | D4 | D5 | D6 | D7 | DQ0 |
| DQ1 | D0 | D1 | D2 | D3 | D4 | D5 | D6 | D7 | DQ1 |
| DQ2 | D0 | D1 | D2 | D3 | D4 | D5 | D6 | D7 | DQ2 |
| DQ3 | D0 | D1 | D2 | D3 | D4 | D5 | D6 | D7 | DQ3 |
| DQ4 | D0 | D1 | D2 | D3 | D4 | D5 | D6 | D7 | DQ4 |
| DQ5 | D0 | D1 | D2 | D3 | D4 | D5 | D6 | D7 | DQ5 |
| DQ6 | D0 | D1 | D2 | D3 | D4 | D5 | D6 | D7 | DQ6 |
| DQ7 | D0 | D1 | D2 | D3 | D4 | D5 | D6 | D7 | DQ7 |
|  |  |  |  |  |  |  |  |  |  |
| EDBI |  | EDBI0 | EDBI1 | EDBI2 | EDBI3 | EDBI4 | EDBI5 | EDBI6 | EDBI |
| IDBI |  | IDBI0 | IDBI1 | IDBI2 | IDBI3 |  |  |  | IDBI |

[FIG. 10]

| Host Port | t1 | t2 | t3 | t4 | t5 | t6 | t7 | t8 | HBM Port |
|---|---|---|---|---|---|---|---|---|---|
| DQ0 | D0 | D1 | D2 | D3 | D4 | D5 | D6 | D7 | DQ0 |
| DQ1 | D0 | D1 | D2 | D3 | D4 | D5 | D6 | D7 | DQ1 |
| DQ2 | D0 | D1 | D2 | D3 | D4 | D5 | D6 | D7 | DQ2 |
| DQ3 | D0 | D1 | D2 | D3 | D4 | D5 | D6 | D7 | DQ3 |
| DQ4 | D0 | D1 | D2 | D3 | D4 | D5 | D6 | D7 | DQ4 |
| DQ5 | D0 | D1 | D2 | D3 | D4 | D5 | D6 | D7 | DQ5 |
| DQ6 | D0 | D1 | D2 | D3 | D4 | D5 | D6 | D7 | DQ6 |
| DQ7 | D0 | D1 | D2 | D3 | D4 | D5 | D6 | D7 | DQ7 |
|  |  |  |  |  |  |  |  |  |  |
| EDBI |  | EDBI0 | EDBI1 | EDBI2 | EDBI3 | EDBI4 | EDBI5 | EDBI6 | EDBI |
| IDBI |  | IDBI0 |  | IDBI1 |  | IDBI2 |  | IDBI3 | IDBI |

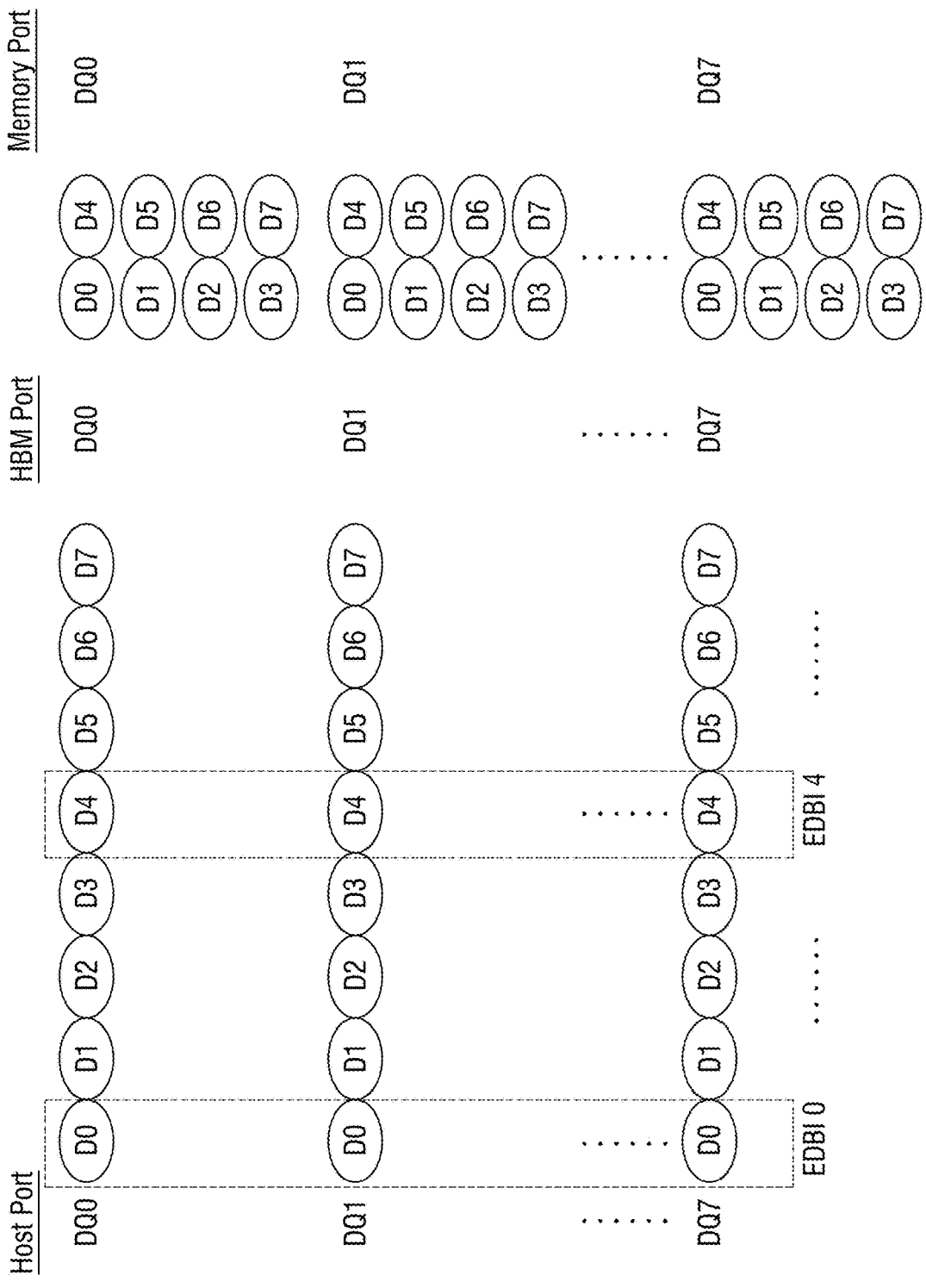

[FIG. 12]

| Host Port | t1 | t2 | t3 | t4 | t5 | t6 | t7 | t8 | HBM Port |
|---|---|---|---|---|---|---|---|---|---|
| DQ0 | D0 | D1 | D2 | D3 | D4 | D5 | D6 | D7 | DQ0 |
| DQ1 | D0 | D1 | D2 | D3 | D4 | D5 | D6 | D7 | DQ1 |
| DQ2 | D0 | D1 | D2 | D3 | D4 | D5 | D6 | D7 | DQ2 |
| DQ3 | D0 | D1 | D2 | D3 | D4 | D5 | D6 | D7 | DQ3 |
| DQ4 | D0 | D1 | D2 | D3 | D4 | D5 | D6 | D7 | DQ4 |
| DQ5 | D0 | D1 | D2 | D3 | D4 | D5 | D6 | D7 | DQ5 |
| DQ6 | D0 | D1 | D2 | D3 | D4 | D5 | D6 | D7 | DQ6 |
| DQ7 | D0 | D1 | D2 | D3 | D4 | D5 | D6 | D7 | DQ7 |
| EDBI | EDBI0 | EDBI1 | EDBI2 | EDBI3 | EDBI4 | EDBI5 | EDBI6 | EDBI7 | EDBI |
| IDBI | IDBI0 | IDBI1 | IDBI2 | IDBI3 | | | | | IDBI |

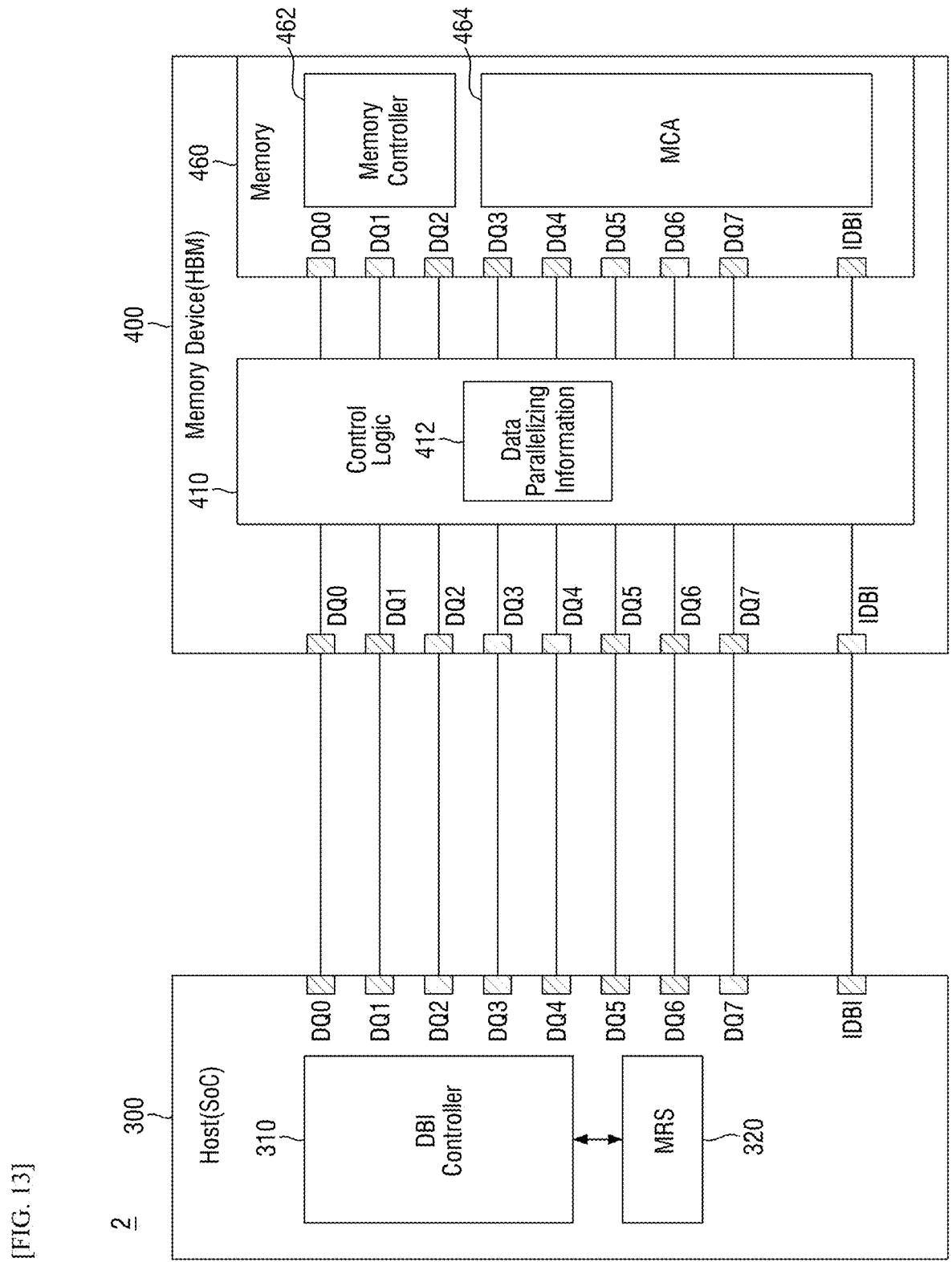

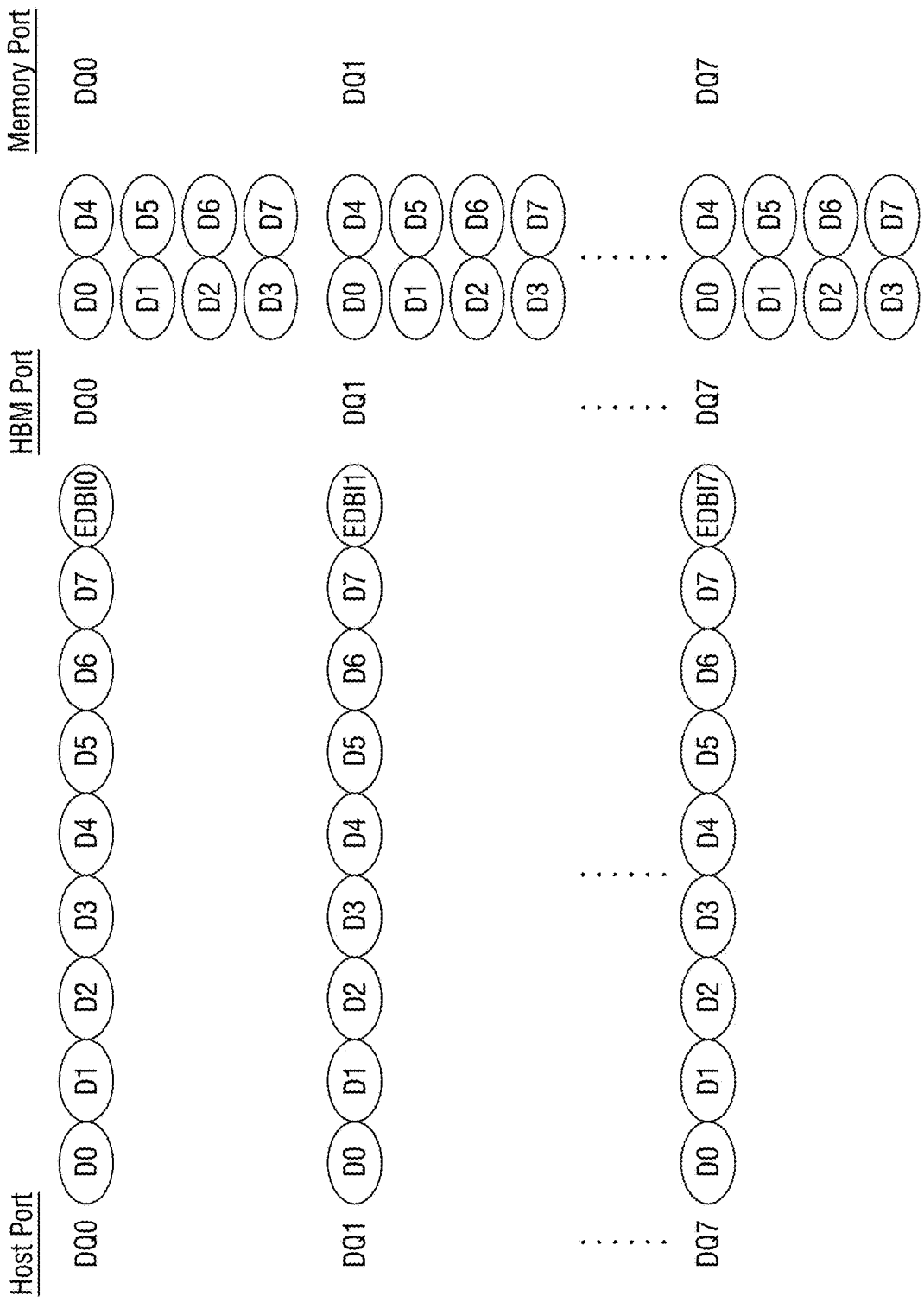
[FIG. 14]

[FIG. 15]
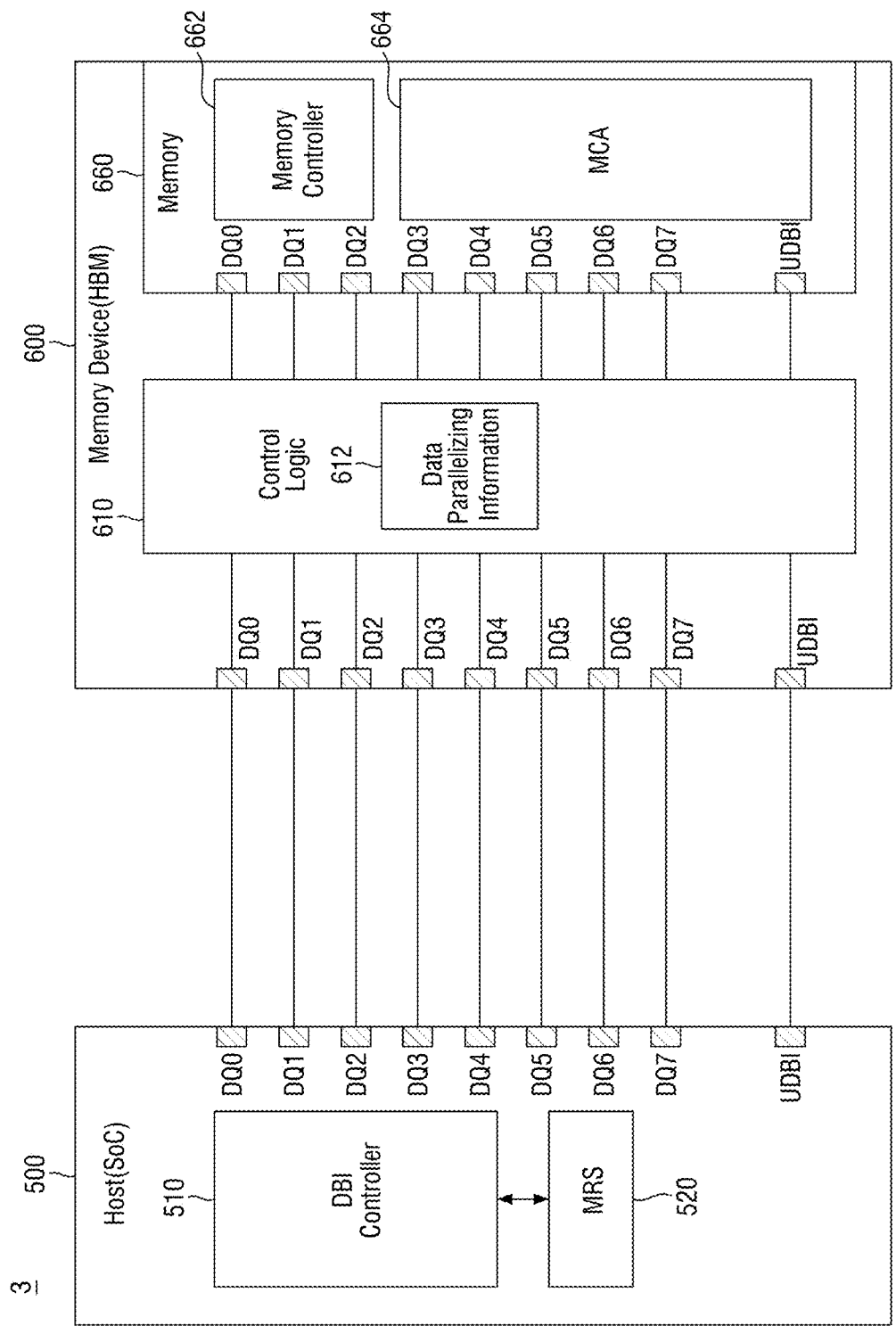

[FIG. 16]
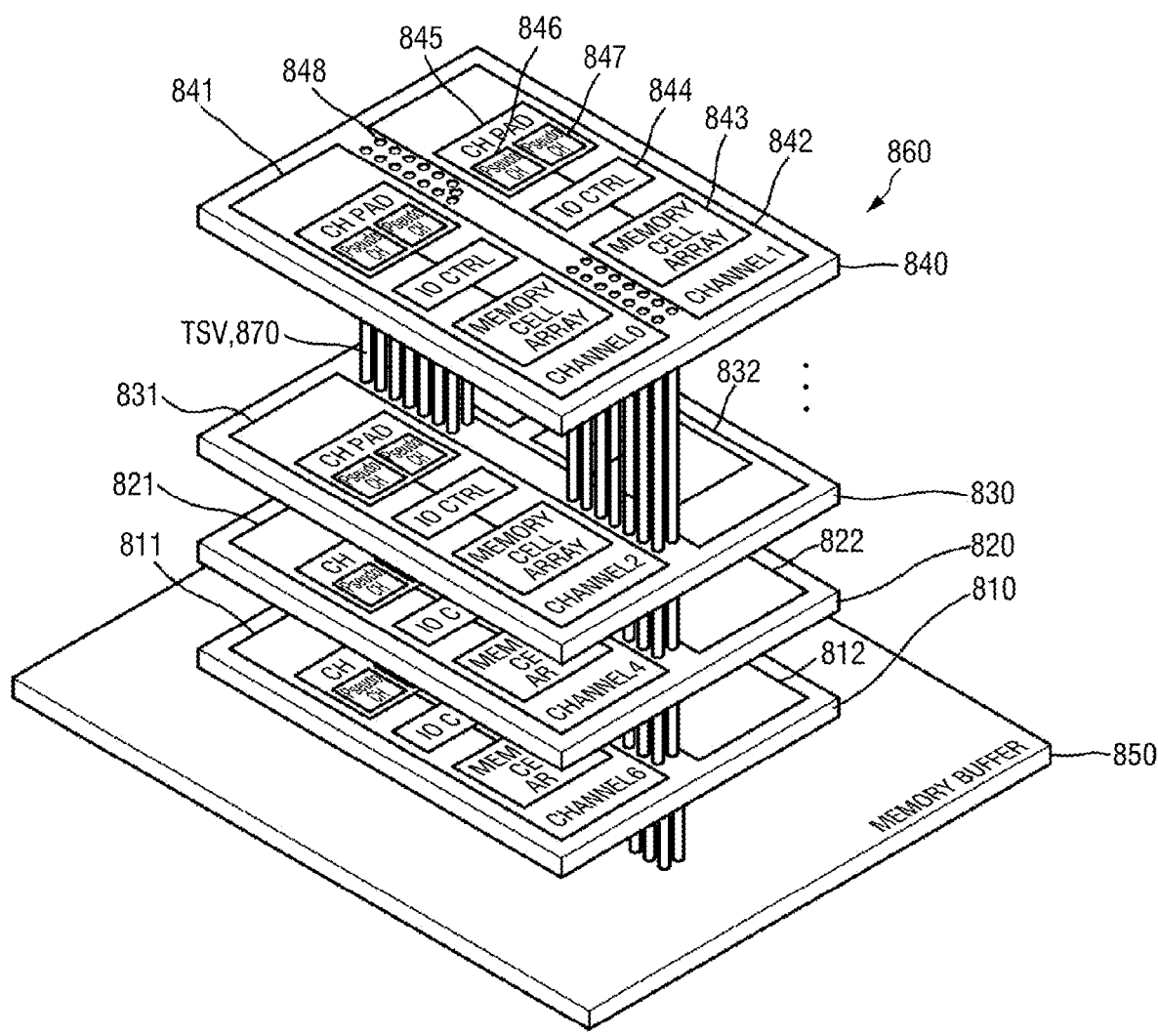

U.S. 11,409,676 B2

SYSTEM ON CHIP, MEMORY DEVICE, ELECTRONIC DEVICE COMPRISING THE SOC AND MEMORY DEVICE, AND METHOD FOR STORING DATA IN THE ELECTRONIC DEVICE

This application claims priority from Korean Patent Application No. 10-2019-0167984 filed on Dec. 16, 2019 in the Korean Intellectual Property Office, the disclosure of which is incorporated herein by reference in its entirety.

BACKGROUND

Example embodiments relate to a System on Chip (SoC), a memory device, an electronic device, and/or a method for storing data in the electronic device.

Data bits which move through a data bus may be sensitive to a cross-talk, a simultaneous switching noise (SSN), an inter-symbol interference (ISI) and/or the like, depending on a state of data or a frequency of data transition. A data encoding method such as a data bus inversion (DBI) may be used to reduce such adverse effects.

Meanwhile, in order to support various systems such as graphics, servers, supercomputers, and/or networks that require high performance and low power consumption, a high-bandwidth memory (HBM) which provides a multi-channel interface type of wide input and output is used.

The HBM may execute DBI on a channel including a plurality of data bits, for example, on a byte basis. There is a desire and/or need for a research on a method for determining the DBI bit to improve an operating speed of the HBM.

SUMMARY

Aspects of example embodiments provide an electronic device with an improved data storage speed.

Aspects of example embodiments also provide a method for storing data in an electronic device with an improved data storage speed.

Aspects of example embodiments also provide a memory device with an improved data storage speed.

Aspects of example embodiments also provide a SoC that calculates a DBI bit and provides the DBI bit to a memory device so that a data storage speed may be improved.

However, aspects of example embodiments are not restricted to the one set forth herein. The above and other aspects of example embodiments will become more apparent to one of ordinary skill in the art to which example embodiments pertains by referencing the detailed description of example embodiments given below.

According to some example embodiments, there is provided an electronic device comprising a host configured to output data, and a memory device including a memory storage configured to receive the data and to store the data. The host is configured to generate data bus inversion (DBI) information on the data to be provided to the memory device in accordance with a data parallelizing system, the data parallelizing system being inside the memory device, and to provide the DBI information to the memory device. The memory device is configured to provide the data to the memory storage, the data output from the host, the data encoded in accordance with the DBI information, the providing the data being in accordance with the data parallelizing system.

According to some example embodiments, there is provided a method for storing data in an electronic device comprising providing, to a host by a memory device, information on a data parallelizing system, the information inside the memory device, calculating, by the host, an external DBI bit on the basis of data to be provided to the memory device, providing, by the host, the external DBI bit to the memory device, encoding, by the host, the data to be stored in the memory device using the external DBI bit, providing, by the host, the data to the memory device, calculating, by the host, an internal DBI bit on the basis of the data provided to the memory device and information on a data parallelizing system provided from the memory device, and providing, by the host, the internal DBI bit to the memory device.

According to some example embodiments, there is provided a memory device comprising a memory storage configured to store data provided through a first input port, and control logic configured to receive the data from outside through a second input port, to rearrange the data provided through the second input port in accordance with a data parallelizing system, and to provide the data to the memory storage through the first input port. The control logic is configured to receive an internal DBI bit of the data from the outside, the internal DBI generated on the basis of the data parallelizing system, to encode the data using the internal DBI bit, and to provide the encoded data and the internal DBI bit to the memory storage.

According to some example embodiments, there is provided an SoC comprising an output port configured to output a plurality of sub-data in accordance with a first array, and a data bus inversion (DBI) controller configured to receive information on a data parallelizing system from outside, to generate DBI bits of a plurality of sub-data which is output through the output port on the basis of information on the provided data parallelizing system, and to output the generated DBI bit together with the plurality of sub-data. The information on the data parallelizing system is information relating to a rearrangement of the plurality of sub-data into a second array different from the first array. The DBI bit is associated with a decoding of the plurality of sub-data rearranged into the second array.

BRIEF DESCRIPTION OF THE DRAWINGS

The above and other aspects and features of example embodiments will become more apparent by describing in detail example embodiments thereof with reference to the attached drawings, in which:

FIG. 1 is a block diagram of an electronic device according to some example embodiments;

FIG. 2 is a diagram showing a table stored in a mode register set of FIG. 1;

FIG. 3 is a flowchart showing a method for storing data in the electronic device according to some example embodiments;

FIGS. 4 to 10 are diagrams for explaining a method for storing data in an electronic device according to some example embodiments;

FIGS. 11 and 12 are diagrams for explaining a method for storing data in an electronic device according to some example embodiments;

FIG. 13 is a block diagram of an electronic device according to some example embodiments;

FIG. 14 is a diagram for explaining the operation of the electronic device shown in FIG. 13;

FIG. 15 is a block diagram of an electronic device according to some example embodiments; and FIG. 16 is a diagram showing an example of a memory included in the electronic device according to some example embodiments.

DETAILED DESCRIPTION OF EXAMPLE EMBODIMENTS

Hereinafter, an embodiment according to the technical idea of example embodiments will be described with reference to the attached drawings.

FIG. 1 is a block diagram of an electronic device according to some example embodiments.

Referring to FIG. 1, an electronic device 1 includes a host 100 and a memory device 200.

The memory device 200 may include control logic 210 and a memory storage/memory 260. In some example embodiments, although the memory device 200 may be a high-bandwidth memory (HBM) that provides a multi-channel interface type of wide input and output, some example embodiments are not limited thereto.

Although FIG. 1 shows only one memory 260 included in the memory device 200 for convenience of understanding, some example embodiments are not limited to the shown embodiments. The memory 260 may be capable of storing data, and also of performing operations on the data. Further, if desired, the memory device 200 may include a plurality of memories 260 and the control logic 210 may interface with the plurality of memories 260 in a multi-channel manner.

The memory 260 may include a plurality of input ports DQ0 to DQ7, an internal data bus inversion port (IDBI), a memory controller 262, and a memory cell array 264.

The memory controller 262 may decode data provided through the plurality of input ports DQ0 to DQ7 of the memory 260, on the basis of internal DBI information provided through the internal DBI port IDBI of the memory 260. Further, the memory controller 262 may store the decoded data in the memory cells included in the memory cell array 264.

In some example embodiments, although the memory 260 includes, for example, a volatile memory such as a dynamic random access memory (DRAM), and the memory cells included in the memory cell array 264 may include, for example, a DRAM cell made up of a capacitor, some example embodiments are not limited thereto.

Alternatively or additionally, the memory 260 may be or include a resistive random access memory (RRAM or ReRAM), a phase change random access memory (PRAM), and/or a ferroelectric random access memory (FRAM). Alternatively or additionally, the memory 260 may include a magnetic random access memory (MRAM) structure, such as an STT-MRAM (Spin-Transfer Torque Magnetic Random Access Memory), a Spin-RAM (Spin Torque Transfer Magnetization Switching RAM), and/or an SMT-RAM (Spin Momentum Transfer).

The control logic 210 may receive, or receive provision of, data from the outside (e.g., the host 100) through the plurality of input ports DQ0 to DQ7 of the memory device 200. Further, the control logic 210 may receive external DBI information from the outside (e.g., the host 100) through an external DBI port EDBI of the memory device 200. Further, the control logic 210 may receive internal DBI information from the outside (e.g., the host 100) through the internal DBI port IDBI of the memory device 200. Although the outside may correspond to the host 100, example embodiments are not limited thereto.

The control logic 210 may decode data provided through the plurality of input ports DQ0 to DQ7 of the memory device 200, on the basis of the external DBI information provided through the external DBI port EDBI of the memory device 200. Further, the control logic 210 may encode the data, using the internal DBI information provided through the internal DBI port IDBI of the memory device 200. Further, the control logic 210 may rearrange the data encoded according to the internal DBI information in accordance with information such as data parallelizing information 212 (e.g., may parallelize and rearrange serialized and transmitted data), and then may provide the rearranged data to the plurality of input ports DQ0 to DQ7 of the memory 260.

Here, the data parallelizing information 212 may be or include information on a data parallelizing system which parallelizes data in an internal data bus of the memory device 200 and/or which provides the data to the memory 260.

At this time, the control logic 210 may also transmit the internal DBI information, which is provided from the outside (e.g., from the host 100), to the internal DBI port IDBI of the memory 260 so that the memory 260 may decode the rearranged data.

For example, according to some example embodiments, the control logic 210 of the memory device 200 does not calculate the internal DBI information on the data provided to the plurality of input ports DQ0 to DQ7 of the memory 260, but directly transmits the internal DBI information, which is provided from the outside (e.g., the host 100), to the memory 260. As a result, since a time for calculating the internal DBI information in the memory device 200 is unnecessary/not used and/or not required, the data storage speed of the memory device 200 or the electronic device 1 may be improved.

In some example embodiments, the external DBI information includes a plurality of external DBI bits, and the internal DBI information may include a plurality of internal DBI bits. For example, the external DBI information may be made up of or include a combination of a plurality of external DBI bits, and the internal DBI information may be made up of or include a combination of a plurality of internal DBI bits. A specific description thereof will be provided below.

Meanwhile, although FIG. 1 shows that the data parallelizing information 212 is included in the control logic 210 of the memory device 200 for convenience of description, example embodiments are not limited thereto. In some example embodiments, the data parallelizing information 212 may be stored in another region of the memory device 200 (e.g., another storage region).

The host 100 may provide data and/or commands to the memory device 200. Specifically, the host 100 may provide a command (e.g., a write command) for instructing the memory device 200 to store data, and data to be stored in the memory device 200.

In some example embodiments, the host 100 may include, for example, a SoC (System on Chip). Although it is not shown in detail, the host 100 may include a host controller for performing such an operation. In some example embodiments, although the host 100 may include, for example, a central processing unit (CPU), a graphics processing unit (GPU), an acceleration processing unit (APU), an application processor (AP), and the like, some example embodiments are not limited thereto.

The host 100 must include a plurality of output ports DQ0 to DQ7, an external DBI port EDBI, an internal DBI port IDBI, a DBI controller 110 and a mode register set 120.

The host 100 may output data to be stored in the memory device 200 through the plurality of output ports DQ0 to DQ7.

The DBI controller 110 may calculate the DBI information on the data to be provided to the memory device 200 through the plurality of output ports DQ0 to DQ7 of the host 100, and may encode data to be provided to the device 200 in accordance with the calculated DBI information.

Specifically or for example, the DBI controller 110 may generate the external DBI information for decoding the data, which is provided to the plurality of input ports DQ0 to DQ7 of the memory device 200 through the plurality of output ports DQ0 to DQ7 of the host 100, by the control logic 210 of the memory device 200. Further, the DBI controller 110 may provide the generated external DBI information to the memory device 200 through the external DBI port EDBI of the host 100, and may encode data to be provided to a plurality of input ports DQ0 to DQ7 of the memory device 200 through a plurality of output ports DQ0 to DQ7 of the host 100, using the external DBI information. The data thus encoded may be provided to the memory device 200 through the plurality of output ports DQ0 to DQ7 of the host 100.

For example, when the data is made up of or corresponds to a plurality of sub-data, and the host 100 provides a plurality of sub-data to the plurality of input ports DQ0 to DQ7 of the memory device 200 in accordance with a first array (e.g., a serialized array), the DBI controller 110 generates external DBI information in which the control logic 210 of the memory device 200 may decode the data received through the plurality of input ports DQ0 to DQ7 of the memory device 200, and the DBI controller 110 may encode data to be provided to the plurality of input ports DQ0 to DQ7 of the memory device 200 through the plurality of output ports DQ0 to DQ7 of the host 100. Further, the DBI controller 110 may provide the generated external DBI information to the memory device 200 through the external DBI port EDBI of the host 100, and may provide the data encoded through the plurality of output ports DQ0 to DQ7 of the host 100 to the memory device 200.

Next, the DBI controller 110 may generate the internal DBI information for decoding the data provided to the plurality of input ports DQ0 to DQ7 of the memory 260 by the memory controller 262 of the memory 260, on the basis of the data parallelizing information 212. Further, the DBI controller 110 may provide the generated internal DBI information to the memory device 200 through the internal DBI port IDBI of the host 100.

For example, when the data is made up of or corresponds to a plurality of sub-data, and the control logic 210 provides the plurality of sub-data to the plurality of input ports DQ0 to DQ7 of the memory 260 in accordance with a second array (e.g., a parallelized array) instead of the first array, the DBI controller 110 may generate internal DBI information in which the memory controller 262 of the memory 260 may decode data received through the plurality of input ports DQ0 to DQ7 of the memory 260. Additionally or alternatively, the DBI controller 110 may provide the generated internal DBI information to the memory device 200 through the internal DBI port IDBI of the host 100. The control logic 210 of the memory device 200 which receives the provision of the internal DBI information uses the internal DBI information when encoding the data provided to the memory 260, and may provide the internal DBI information, which is transmitted from the host 100, to the memory 260 to be able to decode the data received from the memory 260.

In some example embodiments, although the data parallelizing information 212 stored in the memory device 200 may be include information on a method for converting the first arranged sub-data described above into the second arranged sub-data, some example embodiments are not limited thereto.

The DBI controller 110 of the host 100 may receive provision of (e.g. may receive) the data parallelizing information 212 from the memory device 200, and may generate internal DBI information with reference to the provided data parallelizing information 212 and the table stored in the mode register set 120. Hereinafter, a more specific explanation will be given with reference to FIG. 2.

FIG. 2 is a diagram showing a table stored in the mode register set of FIG. 1.

Referring to FIG. 2, the mode register set 120 may store a table 122 in which a DBI scheme according to the data parallelizing system is defined. Specifically, the table 122 may include different internal DBI schemes for each data mapping case. For example, if the internal data parallelizing system of the memory device (200 of FIG. 1) provided from the memory device (200 of FIG. 1) is a first case (case 1), the DBI controller (110 of FIG. 1) generates the internal DBI information using a first scheme (scheme 1), and if the internal data parallelizing system of the memory device (200 of FIG. 1) provided from the memory device (200 of FIG. 1) is a second case (case 2), the DBI controller (110 of FIG. 1) may generate the internal DBI information using a second scheme (scheme 2).

In some example embodiments, the DBI controller (110 of FIG. 1) may determine the internal DBI scheme in accordance with the internal data parallelizing system of the memory device (e.g. memory device 200 of FIG. 1), for example, by software. Alternatively or additionally, in some example embodiments, the DBI controller (e.g. DBI controller 110 of FIG. 1) may determine the internal DBI scheme in accordance with the internal data parallelizing system of the memory device (200 of FIG. 1), for example, using hardware such as a fuse and/or an antifuse.

In this way, when the electronic device 1 according to example embodiments stores data in the memory 260, since the control logic 210 of the memory device 200 receives and uses the internal DBI information calculated in advance from the host 100, without using the internal DBI operation required/used for encoding the data by itself, the data storage time may be reduced.

Hereinafter, a method for storing data in the electronic device according to some example embodiments will be described with reference to FIGS. 3 to 10.

FIG. 3 is a flowchart showing the method for storing data in the electronic device according to some example embodiments. FIGS. 4 to 10 are diagrams for explaining the method for storing data in the electronic device according to some example embodiments.

First, referring to FIG. 3, information on a data parallelizing system is transmitted (S100).

For example, referring to FIG. 4, at the time when the memory device 200 is booted up, the memory device 200 may transmit information on the data parallelizing system to the host 100. However, embodiments are not limited thereto, and alternatively or additionally the memory device 200 may provide the host 100 with information on the data parallelizing system at a different time other than the boot-up time.

Referring again to FIG. 3, a DBI scheme is selected on the basis of the data parallelizing system (S200).

FIG. 5 is a diagram showing an example of the data parallelizing system. Hereinafter, the method for storing data in the electronic device according to the technical idea of example embodiments will be described, as an example in which an electronic device operates in a data parallelizing system shown in FIG. 5; however, the description is for illustrative purposes and example embodiments are not specifically limited to the specific arrangements of FIG. 5.

Referring to FIGS. 1 and 5, the data may include, for example, a plurality of continuous/contiguous sub-data D0 to D7. Here, sub-data D0 may be output from the host 100 earlier than (at an earlier time than) sub-data D1, and the sub-data D1 may be output from the host 100 earlier than (at an earlier time than) sub-data D2.

In some example embodiments, data may be provided from the host 100 to the memory device 200, for example, on a byte basis. In this case, the sub-data D0 to D7 may be sub-components that constitute/correspond to data on the byte basis. Also, in some example embodiments, although one sub-data (e.g., D0) may define a unit burst length, example embodiments are not limited thereto.

The host 100 sequentially outputs the sub-data D0 to D7 encoded in accordance with the external DBI information through each of the output ports DQ0 to DQ7, and the memory device 200 may receive the sub-data D0 to D7 that are sequentially output from the host 100 through the input ports DQ0 to DQ7.

On the other hand, the control logic 210 of the memory device 200 decodes the received sub-data D0 to D7 in accordance with the external DBI information, and may encode the decoded data in accordance with the internal DBI information provided from the host 100.

Alternatively or additionally, the control logic 210 of the memory device 200 may rearrange the encoded data in accordance with the internal data parallelizing system and provide the rearranged data to the input ports DQ0 to DQ7 of the memory 260. For example, the control logic 210 may parallelize sub-data D0 to D7 received in the order of D0, D1, D2, D3, D4, D5, D6 and D7 as shown in the memory 260 and provide the parallelized sub-data D0 to D7 to the memory 260 as shown. That is/for example, the sub-data D0 to D7 provided from the host 100 through the input ports DQ0 to DQ7 of the memory device 200 may be rearranged by the control logic 210 in accordance with the data parallelizing information 212 and may be provided to the memory 260.

The DBI controller 110 of the host 100 provided with the information on the data parallelizing system as shown in FIG. 5 may select an internal DBI scheme corresponding to the data parallelizing system shown in FIG. 5.

Referring to again FIG. 3, DBI information is calculated (S300).

Referring back to FIG. 1, for example, the DBI controller 110 of the host 100 may perform a DBI calculation, using a selected DBI scheme.

In some example embodiments, the DBI controller 110 may calculate the external DBI information used for decoding the data received through the input ports DQ0 to DQ7 of the memory device 200 by the control logic 210. Further, the DBI controller 110 may calculate the internal DBI information used for decoding the data received through the input ports DQ0 to DQ7 of the memory 260 by the memory controller 262, using the selected DBI scheme.

First, an example in which the DBI controller 110 calculates the external DBI information will be described with reference to FIG. 6.

The DBI may go through a process of first evaluating a relationship between the data bits transmitted to/onto the data bus and determining whether it is beneficial to invert none, some or all of the data bits prior to transmission. If it is beneficial to transmit the data bits in the inverted state, the DBI bit indicating that the data bits are inverted may be set high (or, alternatively, may be set to low).

Referring to FIGS. 1 and 6, the DBI controller 110 may calculate the external DBI information on the basis of whether a toggle occurs between the adjacent sub-data D0 to D7 which are output through the plurality of output ports DQ0 to DQ7 of the host 100.

Specifically, if the number of times of toggle occurring between the sub-data D0 and the sub-data D1 output through the plurality of output ports DQ0 to DQ7 of the host 100 is four or more, the DBI controller 110 may determine the external DBI bit EDBI0 constituting/corresponding to the external DBI information as high, e.g. as 1. Further, if the number of times of toggle occurring between the sub-data D0 and the sub-data D1 is less than four, the DBI controller 110 may determine the external DBI bit EDBI0 constituting the external DBI information as low, e.g. as 0.

For example, if the toggle occurs between the sub-data D0 and the sub-data D1 which are output through the output ports DQ0, DQ1, DQ2, DQ3, and DQ4 of the host 100, but the toggle does not occur between the sub-data D0 and the sub-data D1 which are output through the output ports DQ5, DQ6 and DQ7 of the host 100, the DBI controller 110 may determine the external DBI bit EDBI0 as 1 (high).

Similarly, if the number of times of toggle occurring between the sub-data D4 and the sub-data D5 which are output through the plurality of output ports DQ0 to DQ7 of the host 100 is 4 or more, the DBI controller 110 may determine the external DBI bit EDBI4 constituting the external DBI information as 1 (high). Further, if the number of times of toggle occurring between the sub-data D4 and the sub-data D5 is less than 4, the DBI controller 110 may determine the external DBI bit EDBI4 constituting the external DBI information as 0 (low).

Through such a process, the DBI controller 110 may determine the external DBI bits (EDBI0 to EDBI6 of FIG. 9) constituting/corresponding to the external DBI information. Further, when the data is encoded using the external DBI bits (EDBI0 to EDBI6 of FIG. 9) determined in this way, the number of times of toggle may be reduced in the process of the data transmission between the host 100 and the memory device 200 as compared with the non-encoded data.

Next, referring to FIGS. 1 and 7, the DBI controller 110 may calculate the internal DBI information on the basis of whether a toggle occurs between the adjacent sub-data D0 to D7 received through the plurality of input ports DQ0 to DQ7 of the memory 260.

Specifically, if the number of times of the toggle occurring between the sub-data D0 and the sub-data D4 received through the plurality of input ports DQ0 to DQ7 of the memory 260 is four or more, the DBI controller 110 may determine the internal DBI bit IDBI0 constituting the internal DBI information as high, e.g. 1. Further, if the number of times of toggle occurring between the sub-data D0 and the sub-data D4 is less than four, the DBI controller 110 may determine the internal DBI bit IDBI0 constituting the internal DBI information as low, e.g. 0.

For example, if a toggle occurs between the sub-data D0 and the sub-data D4 received through the input ports DQ0, DQ1, DQ2, DQ3 and DQ4 of the memory 260, but a toggle does not occur between the sub-data D0 and the sub-data D4 received through the input ports DQ5, DQ6 and DQ7 of the memory 260, the DBI controller 110 may determine the internal DBI bit IDBI0 as 1.

Next, referring to FIGS. 1 and 8, similarly, if the number of times of toggle occurring between the sub-data D1 and the sub-data D5 received through a plurality of input ports DQ0 to DQ7 of the memory 260 is 4 or more, the DBI controller 110 may determine the internal DBI bit IDBI1 constituting/corresponding to the internal DBI information as 1. Further, if the number of times of toggle occurring between the sub-data D1 and the sub-data D5 is less than 4, the DBI controller 110 may determine the internal DBI bit IDBI1 constituting/corresponding to the internal DBI information as low, e.g. 0.

For example, if a toggle occurs between the sub-data D1 and the sub-data D5 received through the input ports DQ0, DQ1 and DQ2 of the memory 260, but a toggle does not occur between the sub-data D1 and the sub-data D5 received through the input ports DQ3, DQ4, DQ5, DQ6 and DQ7 of the memory 269, the DBI controller 110 may determine the internal DBI bit IDBI1 as low, e.g. 0.

Through such a process, the DBI controller 110 may determine the internal DBI bits (IDBI0 to IDBI3 of FIG. 9) constituting/corresponding to the internal DBI information. Further, when the data is encoded using the internal DBI bits (IDBI0 to IDBI3 of FIG. 9) determined in this way, the number of times of toggle may be reduced in the process of data transmission between the control logic 210 and the memory 260 as compared with the non-encoded data. Although as used herein, values are described as being high and/or low, e.g. as 1 and/or 0, example embodiments are not limited thereto. For example, values may respectively be described as low and/or high.

Referring to FIG. 3 again, the calculated DBI information and data may be transmitted (S400).

For example, referring to FIGS. 1 and 9, the host 100 may transmit the encoded sub-data D0 to D7 using the external DBI information through the output ports DQ0 to DQ7 together with the write command, transmit the external DBI information EDBI0 to EDBI6 through the external DBI port EDBI, and transmit the internal DBI information IDBI0 to IDBI3 through the internal DBI port IDBI.

FIG. 9 illustrates an example in which the sub-data D0 is transmitted at a first time t1, the sub-data D1, the external DBI bit EDBI0, and the internal DBI bit IDBI0 are transmitted at a second time t2, the sub-data D2, the external DBI bit EDBI1, and the internal DBI bit IDBI1 are transmitted at a third time t3, the sub-data D3, the external DBI bit EDBI2, and the internal DBI bit IDBI2 are transmitted at a fourth time t4, the sub-data D4, the external DBI bit EDBI3, and the internal DBI bit IDBI3 are transmitted at a fifth time t5, the sub-data D5 and the external DBI bit EDBI4 are transmitted at a sixth time t6, the sub-data D6 and the external DBI bit EDBI5 are transmitted at a seventh time t7, and the sub-data D7 and the external DBI bit EDBI6 are transmitted at an eighth time t8. By transmitting the sub-data D0 to D7, the external DBI information EDBI0 to EDBI6 and the internal DBI information IDBI0 to IDBI3 in this way, it may be possible to minimize and/or reduce unnecessary and/or undesirable data transmission time between the host 100 and the memory device 200.

However, example embodiments are not limited thereto, and the transmission method can be implemented with various modifications. For example, referring to FIG. 10, unlike the aforementioned embodiment shown in FIG. 9, the host 100 may output each of the internal DBI bits IDBI0 to IDBI3 at the second time t2, the fourth time t4, the sixth time t6, and the eighth time t8. By securing a spare time between the transmissions of the internal DBI bits IDBI0 to IDBI3 in this way, additional information may be provided from the host 100 to the memory device 200 as needed.

Referring again to FIG. 3, the received data is decoded using the provided DBI information, and the decoded data is stored (S500).

For example, referring to FIG. 1, first, the control logic 210 may decode data provided from the host 100, using the external DBI information. Additionally or alternatively, the control logic 210 may encode the decoded data in accordance with the internal DBI information provided from the host 100.

Further, the control logic 210 may rearrange the encoded data in accordance with the data parallelizing information 212 and may provide the rearranged data to the memory 260 through a plurality of reception ports DQ0 to DQ7 of the memory 260.

Further, the control logic 210 may provide the internal DBI information provided from the host 100 to the memory 260 through the internal DBI port IDBI of the memory 260.

The memory controller 262 of the memory 260 may decode the data received through the plurality of reception ports DQ0 to DQ7 of the memory 260, using the internal DBI information provided from the host 100, and may store the decoded data in the memory cell array 264.

On the other hand, although FIG. 6 explains an example in which the external DBI information is calculated on the basis of whether the toggle occurs between the adjacent sub-data D0 to D7 which are output through the plurality of output ports DQ0 to DQ7 of the host 100, example embodiments are not limited thereto.

Hereinafter, a method for storing data in the electronic device according to some other embodiments will be described with reference to FIGS. 11 and 12.

FIGS. 11 and 12 are diagrams for explaining a method for storing data in the electronic device according to some example embodiments.

Referring to FIGS. 1 and 11, the DBI controller 110 may calculate the external DBI information, depending on the Hamming weight, e.g. the number of sub-data D0 having a value of 1 (e.g. a high value) among the sub-data D0 which are output through the plurality of output ports DQ0 to DQ7 of the host 100.

Specifically, if the Hamming weight, e.g. the number of sub-data D0 having a value of 1 among the sub-data D0 which are output through the plurality of output ports DQ0 to DQ7 of the host 100 is greater than or equal to a threshold, e.g. 4 or more, the DBI controller 110 may determine the external DBI bit EDBI0 constituting/corresponding to the external DBI information as a high value, e.g. 1. Further, if the Hamming weight, e.g. the number of sub-data D0 having a value of 1 is less the threshold, e.g. less than 4, the DBI controller 110 may determine the external DBI bit EDBI0 constituting/corresponding to the DBI information as 0.

For example, if the sub-data D0 which is output through the output ports DQ0, DQ1, DQ2, DQ3 and DQ4 of the host 100 has a value of 1, but the sub-data D0 which is output through the output ports DQ5, DQ6 and DQ7 has a value of 0, the DBI controller 110 may determine the external DBI bit EDBI0 as 1.

Similarly, if the number of sub-data D4 having a value of 1 among the sub-data D4 which are output through the plurality of output ports DQ0 to DQ7 of the host 100 is greater than a threshold such as 4 or more, the DBI controller 110 may determine the external DBI bit EDBI4 constituting the external DBI information as 1. Further, if the number of sub-data D4 having a value of 1 is less than a threshold such as 4, the DBI controller 110 may determine the external DBI bit EDBI4 constituting the external DBI as 0.

Through such a process, the DBI controller 110 may determine the external DBI bits (EDBI0 to EDBI7 of FIG. 12) constituting/corresponding to the external DBI information.

Next, referring to FIGS. 1 and 12, the host 100 may transmit the sub-data D0, the external DBI bit EDBI0, and the internal DBI bit IDBI0 at the first time t1, transmit the sub-data D1, the external DBI bit EDBI1, and the internal DBI bit IDBI1 at the second time t2, transmit the sub-data D2, the external DBI bit EDBI2, and the internal DBI bit IDBI2 at the third time t3, transmit the sub-data D3, the external DBI bit EDBI3, and the internal DBI bit IDBI3 at the fourth time t4, transmit the sub-data D4 and the external DBI bit EDBI4 at the fifth time t5, transmit the sub-data D5 and the external DBI bit EDBI5 at the sixth time t6, transmit the sub-data D6 and the external DBI bit EDBI6 at the seventh time t7, and transmit the sub-data D7 and the external DBI bit EDBI7 at the eighth time t8. By transmitting the sub-data D0 to D7, the external DBI information EDBI0 to EDBI7 and the internal DBI information IDBI0 to IDBI3 in this way, it may be possible to minimize and/or reduce unnecessary/undesirable data transmission time between the host 100 and the memory device 200, and secure a spare time capable of transmitting additional information through the internal DBI port IDBI.

FIG. 13 is a block diagram of an electronic device according to some example embodiments. FIG. 14 is a diagram for explaining the operation of the electronic device shown in FIG. 13. Hereinafter, repeated explanation of the above-described embodiment will not be provided, and differences will be mainly explained.

Referring to FIG. 13, an electronic device 2 includes a host 300 and a memory device 400.

The memory device 400 may include a plurality of input ports DQ0 to DQ7, an internal DBI port IDBI, control logic 410 and a memory 460.

The control logic 410 may include a data parallelizing system 412. The memory 460 may include a plurality of input ports DQ0 to DQ7, an internal DBI port IDBI, a memory controller 462, and a memory cell array 464.

The host 300 may include a plurality of output ports DQ0 to DQ7, an internal DBI port IDBI, a DBI controller 310, and a mode register set 320.

That is, in some example embodiments, unlike the above-described embodiments, there is no external DBI port (EDBI of FIG. 1) in the host 300 and the memory device 400. Thus, the external DBI information may be provided from the host 100 to the memory device 200 through a port other than the external DBI port (EDBI of FIG. 1).

In some example embodiments, the external DBI information may be provided to the memory device 200 through plurality of output ports DQ0 to DQ7 of the host, as shown in FIG. 14. At this time, a plurality of external DBI bits EDBI0 to EDBI7 constituting the external DBI information may be determined, depending on the number of sub-data D0 to D7 having a value of 1 among the sub-data D0 to D7 which are output from each of the output ports DQ0 to DQ7.

Specifically, if the Hamming weight, e.g. the number of the sub-data D0 to D7 having a value of 1 among the sub-data D0 to D7 which are output through the output port DQ0 of the host 100 is greater than a threshold such as 4 or more, the DBI controller 310 may determine the external DBI bit EDBI0 constituting/corresponding to the external DBI information as 1. Further, if the Hamming weight, e.g. the number of the sub-data D0 to D7 having the value of 1 is less than a threshold such as less than 4, the DBI controller 310 may determine the external DBI bit EDBI0 constituting the external DBI information as 0.

For example, if the sub-data D0 and D2 among the sub-data D0 to D7 which are output through the output port DQ0 have a value of 1, but the sub-data D1 and D3 to D7 have a value of 0, the DBI controller 310 may determine the external DBI bit EDBI0 as 0. Also, if the sub-data D0 to D6 among the sub-data D0 to D7 which are output through the output port DQ1 have a value of 1, but the sub-data D7 has a value of 0, the DBI controller 310 may determine the external DBI bit EDBI1 as 1.

The external DBI bits EDBI0 to EDBI7 thus determined may be provided to the memory device 200 to be continuous/contiguous to the sub-data encoded using the external DBI information through the plurality of output ports DQ0 to DQ7 of the host, as shown.

In the case of the electronic device 2 according to some example embodiments, by reducing the number of input and output ports of the host 300 and the memory device 400 in this way, the size of the electronic device 2 may be reduced and/or miniaturized.

FIG. 15 is a block diagram of the electronic device according to some example embodiments. Hereinafter, repeated explanation of the above-described embodiments will not be provided, and differences will be mainly explained.

Referring to FIG. 15, an electronic device 3 includes a host 500 and a memory device 600.

The memory device 600 may include a plurality of input ports DQ0 to DQ7, a universal DBI port UDBI, control logic 610, and a memory 660.

The control logic 610 may include a data parallelizing system 612. The memory 660 may include a plurality of input ports DQ0 to DQ7, a universal DBI port UDBI, a memory controller 662, and a memory cell array 664.

The host 500 may include a plurality of output ports DQ0 to DQ7, a universal DBI port UDBI, a DBI controller 510 and a mode register set 520.

In some example embodiments, the DBI controller 510 may receive, e.g. may receive the provision of, the data parallelizing system 612, and may output the universal DBI information considering all the external DBI information and the internal DBI information described above through the universal DBI port UDBI of the host 500. Further, the DBI controller 510 may output the data encoded using the universal DBI information through the plurality of output ports DQ0 to DQ7 of the host 500.

The memory controller 660 of the memory device 600 may receive, e.g. may receive the provision of the universal DBI information from the host 100 and may decode the data received through the plurality of input ports DQ0 to DQ7 of the memory device 600. Also, the memory controller 662 of the memory 660 also receives such universal DBI information and may decode the data received through the plurality of input ports DQ0 to DQ7 of the memory 660.

In the case of the electronic device 3 according to some example embodiments, by integrating the DBI information used for decoding data without discriminating between the internal DBI information and the external DBI information as described above, it may be possible to improve the efficiency of the data storage operation of the electronic device 3.

FIG. 16 is a diagram showing an example of a memory included in an electronic device according to some example embodiments.

A memory 860 shown in FIG. 16 may be adopted in the memories (260 of FIG. 1, 460 of FIG. 13, and 660 of FIG. 15) of the aforementioned electronic devices (1 of FIG. 1, 2 of FIG. 13, and 3 of FIG. 15).

Referring to FIG. 16, the memory 860 may include a number of stacked memory layers 810, 820, 830 and 840. The memory 860 may be, for example, an HBM. The memory layers 810, 820, 830 and 840 may constitute/correspond to a number of independent interfaces called channels.

Each of the memory layers 810, 820, 830 and 840 may include two channels 811-812, 821-822, 831-832 and 841-842. Although FIG. 16 shows an example in which four memory layers 810, 820, 830 and 840 are stacked on the memory 860 and configured as eight channels, some example embodiments are not limited to thereto. According to some example embodiments, two to eight memory layers may be stacked on the memory 860.

Each of the channels 811, 812, 821, 822, 831, 832, 841 and 842 may include a memory cell array 843 that operates independently for each channel, an I/O control unit 844 for independently controlling the memory cell array 843 for each channel, and a channel pad unit 845 which provides a channel for the memory cell array 843.

In some example embodiments, the I/O control unit 844 may serve as the aforementioned memory controllers (262 of FIG. 1, 462 of FIG. 13, and 662 of FIG. 15).

The memory cell array 843 includes memory cells connected to a plurality of word lines and bit lines, and the memory cells may be grouped into a plurality of memory banks and/or memory blocks. A row decoder, a column decoder, a sense amplifier, and/or the like for accessing the memory cells may be placed in a region of the memory cell array 843.

The I/O control unit 844 may include a row address strobe (RAS) control logic, a column address strobe (CAS) control logic, and/or the like. The channel pad unit 845 may include pads arranged in a matrix form including a plurality of rows and a plurality of columns. Each of the pads of the channel pad unit 845 may be connected to an electrode 848 and a through-silicon via (TSV) 870 through wiring for signal routing.

The memory 860 may further include a memory buffer 850 placed at a lower end of the stacked memory layers 810, 820, 830, and 840. The memory buffer 850 may include an input buffer (or reception unit) for receiving a command, an address, a clock and data from the control logic, buffers the received command, the address, the clock and the data, and provide them to the channels 811, 812, 821, 822, 831, 832, 841 and 842. The memory buffer 850 may provide a signal distribution function and a data I/O function to the channels 811, 812, 821, 822, 831, 832, 841 and 842 through the electrodes 848 and through-silicon vias 870. In some other embodiments, the memory buffer 850 may serve as the aforementioned memory controller (262 of FIG. 1, 462 of FIG. 13, and 662 of FIG. 15).

The memory buffer 850 may communicate with the control logic through conductive means, such as bumps or solder balls, formed on an outer surface of the memory 860.

Each of the memory layers 810, 820, 830 and 840 includes two channels 811, 812, 821, 822, 831, 832, 841 and 842, and a single channel may be made up of two pseudo channels.

Assuming that the number of data I/O DQ pads included in the region of the channel pad unit 845 of the respective channels 811, 812, 821, 822, 831, 832, 841 and 842 is, for example, 128, one hundred and twenty-eight DQ pads of the channel pad unit 845 of the respective channels 811, 812, 821, 822, 831, 832, 841 and 842 are divided into two groups of pseudo channels 846 and 847, and the number of DQ pads of each of the pseudo channels 846 and 847 may be 64. Here, each of the channels 811, 812, 821, 822, 831, 832, 841 and 842 may receive provision of data through eight DQ pads. The eight DQ pads may correspond to the plurality of input ports (DQ0 to DQ7 of FIG. 1, DQ0 to DQ7 of FIG. 13, and DQ0 to DQ7 of FIG. 15) of the aforementioned memories (260 of FIG. 1, 460 of FIG. 13, and 660 of FIG. 15).

Elements described herein, such as but not limited to be the DBI controller 110, the MRS 120, the control logic 210, the memory controller 262, may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those of ordinary skill in the art will appreciate that many variations and modifications may be made to example embodiments without substantially departing from the principles of example embodiments. Therefore, the disclosed example embodiments of the invention are used in a generic and descriptive sense only and not for purposes of limitation.

What is claimed is:

1. An electronic device comprising:
  a host configured to output data; and
  a memory device including a memory storage configured to receive the data and to store the data,
  wherein the host is configured to generate data bus inversion (DBI) information on the data to be output to the memory device in accordance with a data parallelizing system, the data parallelizing system being inside the memory device, and to output the DBI information to the memory device, and
  the memory device is configured to provide the data to the memory storage, the data output from the host, the data encoded in accordance with the DBI information, the providing the data being in accordance with the data parallelizing system.

2. The electronic device of claim 1, wherein the DBI information generated by the host includes,
  first DBI information relating to the data to be provided to the memory device, and
  second DBI information related to the data to be provided to the memory storage,
  the host is configured to provide the data to the memory device, the data encoded using the first DBI information and the second DBI information,
  the memory device is configured to decode the data provided from the host, the decoding based on the first DBI information,
  the memory device is configured to provide the second DBI information to the memory storage,
  the memory device is configured to provide the data to the memory storage, the data encoded using the second DBI information, the providing the data being in accordance with the data parallelizing system, and
  the memory storage is configured to decode the data provided from the memory device using the second DBI information.

3. The electronic device of claim 2, wherein the memory device is configured to provide the second DBI information to the memory storage without calculating the second DBI information, the second DBI information provided from the host.

4. The electronic device of claim 1, wherein the memory device is configured to store information on the data parallelizing system, and
the host is configured to store a table that defines a DBI scheme according to the data parallelizing system.

5. The electronic device of claim 4, wherein the memory device is configured to provide information on the data parallelizing system to the host upon a booting up of the memory device, and
the host is configured to determine a DBI scheme on the basis of the information on the data parallelizing system, to generate the DBI information using the determined DBI scheme, and to provide the DBI information to the memory device, the DBI information being provided together with the data encoded with the DBI information.

6. The electronic device of claim 1, wherein the host includes a first external DBI port and a first internal DBI port,
the memory device includes a second external DBI port configured to receive an external DBI bit from the host through the first external DBI port, and a second internal DBI port configured to receive an internal DBI bit from the host through the first internal DBI port, and
the memory storage includes a third internal DBI port configured to receive the internal DBI bit from the memory device through the second internal DBI port.

7. The electronic device of claim 6, wherein the host includes a first output port,
the first output port includes first to eighth data out (DQ) ports,
the data includes first and second contiguous sub-data which are output through each of the first to eighth DQ ports, and
the host is configured to determine an external DBI bit in accordance with a number of toggles which occur to output the first sub-data through the first to eighth DQ ports and then to output the second sub-data through each of the first to eighth DQ ports.

8. The electronic device of claim 6, wherein the host includes a first output port,
the first output port includes first to eighth DQ ports,
the data includes first to eighth contiguous sub-data which are output through each of the first to eighth DQ ports, and
the host is configured to determine the internal DBI bit on the basis of whether a toggle occurs between one sub-data among the first to eighth sub-data and another sub-data which is not contiguous with the one sub-data.

9. The electronic device of claim 1, wherein the host includes a first internal DBI port,
the memory device includes a second internal DBI port configured to receive an internal DBI bit from the host through the first internal DBI port,
the memory includes a third internal DBI port is configured to receive the internal DBI bit from the memory device through the second internal DBI port, and
the host is configured to provide an external DBI bit to the memory device through a first output port of the host, the first output port being an output port from which the host outputs the data.

10. The electronic device of claim 9, wherein the first output port includes first to eighth DQ ports,
the data includes first to eighth contiguous sub-data which are output through each of the first to eighth DQ ports, and
the host is configured to determine the external DBI bit in accordance with the number of sub-data among the first to either sub-data that have a specific value.

11. The electronic device of claim 10, wherein the host is configured to determine the internal DBI bit on the basis of whether a toggle occurs between one sub-data among the first to eighth sub-data and another sub-data which is not contiguous with the one sub-data.

12. A method comprising:
providing, to a host by a memory device, information on a data parallelizing system, the information inside the memory device;
calculating, by the host, an external DBI bit on the basis of data to be provided to the memory device;
providing, by the host, the external DBI bit to the memory device;
encoding, by the host, the data to be stored in the memory device using the external DBI bit;
providing, by the host, the data to the memory device;
calculating, by the host, an internal DBI bit on the basis of the data provided to the memory device and information on a data parallelizing system provided from the memory device; and
providing, by the host, the internal DBI bit to the memory device.

13. The method of claim 12, wherein the host includes a first output port from which the data is output, a second output port from which the external DBI bit is output, and a third output port from which the internal DBI bit is output, and
each of the first to third output ports are different.

14. The method of claim 13, wherein the data includes first to eighth sub-data which are contiguous, and
while the first to eighth sub-data are provided from the host to the memory device, the host provides the external DBI bit and the internal DBI bit to the memory device.

15. The method of claim 12, wherein the host includes a first output port from which the data and the external DBI bit are output, and a second output port from which the internal DBI bit is output, and
the first output port and the second output port are different from each other.

16. The method of claim 12, wherein the memory device includes a memory storage in which the data is stored,
the memory device uses the external DBI bit to decode data provided from the host, and
the memory storage uses the internal DBI bit to decode data provided from the memory device.

17. The method of claim 12, wherein, upon booting up of the memory device, the memory device provide the information on the data parallelizing system to the host.

18. The method of claim 17, wherein the host includes a mode register set (MRS) which stores a table defining a plurality of internal DBI schemes, and
the host selects at least one of the plurality of internal DBI schemes using the data parallelizing system provided from the memory device, and calculates the internal DBI bit using the selected internal DBI.

19. A memory device comprising:
a memory storage configured to store data provided through a first input port; and control logic configured to receive the data from outside through a second input port, to rearrange the data provided through the second input port in accordance with a data parallelizing system, and to provide the data to the memory storage through the first input port, wherein the control logic is configured to receive an internal DBI bit of the data from the outside, the internal DBI generated on the basis of the data parallelizing system, to encode the data using the internal DBI bit, and to provide the encoded data and the internal DBI bit to the memory storage.

20. The memory device of claim 19, wherein the data provided through the second input port includes first to eighth sub-data which are contiguous, and the internal DBI bit corresponds to whether a toggle occurs between one sub-data among the first to eighth sub-data and another sub-data which is not contiguous with the one sub-data.

* * * * *